(12) United States Patent
Hayashi (10) Patent No.: US 7,331,307 B2
(45) Date of Patent: Feb. 19, 2008

(54) THERMALLY SPRAYED MEMBER, ELECTRODE AND PLASMA PROCESSING APPARATUS USING THE ELECTRODE

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 161 days.

(21) Appl. No.: 11/055,058

(22) Filed: Feb. 11, 2005

(65) Prior Publication Data

US 2005/0211384 A1    Sep. 29, 2005

(30) Foreign Application Priority Data

Feb. 13, 2004    (JP)    ............... 2004-037094

(51) Int. Cl.
| | | |
|---|---|---|
| C23C 16/00 | (2006.01) | |
| C23C 16/50 | (2006.01) | |
| C23C 16/503 | (2006.01) | |
| H01L 21/306 | (2006.01) | |
| H01L 21/3065 | (2006.01) | |

(52) U.S. Cl. ............... 118/723 E; 118/715; 118/725; 118/728; 118/729; 118/723 R; 118/730; 156/345.33; 156/345.34; 156/345.47

(58) Field of Classification Search ............... 118/715, 118/725, 728, 729, 739, 723 E, 723 R; 156/345.33, 156/345.34, 345.47
See application file for complete search history.

(56) References Cited

U.S. PATENT DOCUMENTS

| | | | | |
|---|---|---|---|---|
| 5,672,208 A | * | 9/1997 | Morita | ............... 118/723 E |
| 6,079,357 A | * | 6/2000 | Hama | ............... 118/723 I |
| 6,358,324 B1 | * | 3/2002 | Hongoh et al. | ............... 118/728 |
| 6,771,483 B2 | * | 8/2004 | Harada et al. | ............... 361/234 |
| 7,068,489 B2 | * | 6/2006 | Migita | ............... 361/234 |
| 7,104,217 B2 | * | 9/2006 | Himori et al. | ............... 118/723 E |
| 2005/0115677 A1 | * | 6/2005 | Nagahata et al. | ...... 156/345.47 |

FOREIGN PATENT DOCUMENTS

| | | | |
|---|---|---|---|
| JP | 64-057761 | * | 6/1989 |
| JP | 08264462 A | * | 10/1996 |
| JP | 08-264462 | * | 11/1996 |
| JP | 9-69554 | | 3/1997 |
| JP | 2001-49419 | | 2/2001 |

* cited by examiner

*Primary Examiner*—Jeffrie R. Lund
*Assistant Examiner*—Satish Chandra
(74) *Attorney, Agent, or Firm*—Oblon, Spivak, McClelland, Maier & Neustadt, P.C.

(57) ABSTRACT

A thermally sprayed member or an electrode includes a basic material, a thermally sprayed film formed on the surface of the basic material, the thermally sprayed film being made of an insulating ceramic and a metallic intermediate layer provided between the basic material and the thermally sprayed film for increasing a bonding force therebetween, wherein the thermally sprayed film side of the member is exposed to a high frequency plasma atmosphere and the electrode is intended to form a high frequency plasma on the side of the thermally sprayed film. The basic material includes a base portion made of a conductive material and a dielectric portion provided to include a part of a surface of the basic material. Further, the intermediate layer is comprised of a plurality of island-shaped parts isolated from each other.

12 Claims, 8 Drawing Sheets

THERMALLY SPRAYED MEMBER, ELECTRODE AND PLASMA PROCESSING APPARATUS USING THE ELECTRODE

FIELD OF THE INVENTION

The present invention relates to a thermally sprayed member used in a chamber of a plasma processing apparatus, an electrode for generating a plasma and a plasma processing apparatus using such electrode.

BACKGROUND OF THE INVENTION

In manufacturing a semiconductor, liquid crystal device or the like, a plasma processing which employs a plasma has been widely used. In such plasma processing, for components like an electrode exposed to a plasma atmosphere in a chamber, it has been proposed to employ a thermally sprayed film formed on the surface of a basic material of an insulting ceramic with a high corrosion resistance such as alumina ($Al_2O_3$), yttrium oxide ($Y_2O_3$) or the like, so that they can be resistant to the plasma. (see, e.g., page 3, FIG. 2 of Japanese Patent Laid-open Publication No. H9-339895).

When such thermally sprayed films of alumina, yttrium oxide or the like are formed on a basic nonmetal material like ceramic or quartz, if the thermal spraying is carried out by only performing a beads blast, chemical blast or the like on the surface thereof as when a metal basic material is used, because a dielectric-material component has a low tolerance to a hardening shrinkage of the thermally sprayed film, the anchoring effect of the thermally sprayed film deteriorates. As a result, the thermally sprayed film is readily stripped off. In order to eliminate this problem, there has been proposed a method for thermally spraying a soft-metal thin film such as aluminum (Al), nickel (Ni) or the like as an intermediate layer between the basic material and the thermally sprayed film to enhance the anchor therebetween (see, e.g., Japanese Patent Laid-open Publication No. H9-69554).

As for the field of plasma processing, a parallel plate type plasma processing apparatus to form a high frequency electric field between a pair of electrodes disposed vertically facing each other has been widely used. In order to generate a high-density plasma by using such apparatus, the applied frequency needs to be increased. However, when the applied frequency is increased as such, not only does the electric field distribution on the electrode surface becomes nonuniform, but also the plasma density becomes nonuniform as well. Therefore, there has been suggested a method for uniformizing the plasma density by providing a dielectric member such as a ceramic or the like at, e.g., the central portion of an exposed surface of an upper electrode so that the electric field distribution is uniformized (see, e.g., Japanese Patent Laid-open Publication No. 2000-323456).

When the thermally sprayed film is formed on a basic material of the electrode having a dielectric member on the surface thereof, if an intermediate layer (bond-coat layer) is formed as described above, the bond-coat layer itself, which is metal, becomes a conductive layer for a high frequency power. Therefore, the dielectric member, which is intended to obstruct the penetration of a high frequency power, is not able to function as expected.

SUMMARY OF THE INVENTION

It is, therefore, an object of the present invention to provide a thermally sprayed component and electrode having a metallic intermediate layer provided between a basic material and a thermally sprayed film wherein the intermediate layer would not allow a high frequency power to penetrate, and a plasma processing apparatus using such an electrode.

In accordance with one aspect of the invention, there is provided a thermally sprayed member including: a basic material in which at least a part of a surface thereof is made of a dielectric material; a thermally sprayed film formed on the surface of the basic material, the thermally sprayed film being made of an insulating ceramic; and an intermediate layer made of a metal, provided between the basic material and the thermally sprayed film, for increasing a bonding force therebetween, wherein the intermediate layer is composed of a plurality of island-shaped parts separated from each other in a thermally sprayed member in which a thermally sprayed film forming portion thereof is exposed to a high frequency plasma atmosphere.

In accordance with another aspect of the invention, there is provided an electrode including: a basic material including a base portion made of a conductive material and a dielectric portion having a part of a surface of the basic material; a thermally sprayed film provided on the surface of the basic material, the thermally sprayed film being made of an insulating ceramic; and an intermediate layer made of a metal, provided between the basic material and the thermally sprayed film, for increasing a bonding force therebetween, wherein the intermediate layer is composed of a plurality of island-shaped parts separated from each other in an electrode for forming a high frequency plasma on the thermally sprayed film side.

In accordance with still another aspect of the invention, there is provided a plasma processing apparatus for performing a specific plasma process on a substrate to be processed by using a plasma, the apparatus including: a chamber maintained under a decompressed atmosphere, for accommodating therein an object to be processed; a first and a second electrode opposedly provided in the chamber; and a plasma generating unit for generating a plasma of the processing gas by forming a high frequency electric field between the first and the second electrode, wherein at least one of the first and the second electrode includes a basic material having a base portion made of a conductive material and a dielectric portion including a part of a surface of the basic material; a thermally sprayed film provided on the surface of the basic material, the thermally sprayed film being made of an insulating ceramic; and an intermediate layer provided between the basic material and the thermally sprayed film for increasing an adhesivity therebetween, the intermediate layer being formed of a metal and composed of a plurality of island-shaped parts separated from each other.

In accordance with the present invention, since the metallic intermediate layer, which lies between the basic material and the thermally sprayed film, is comprised of a plurality of island-shaped parts isolated from each other, a high frequency current can be blocked off between the island-shaped parts. Therefore, when a high frequency plasma is discharged on the side of the thermally sprayed film, it is prevented from penetrating the intermediate layer. Accordingly, when an electrode in which a thermally sprayed film made of an insulating ceramic is formed on the surface of a basic material having a base portion (made of a conductive material) and a dielectric portion (partially including the surface of the basic material) via the intermediate layer made of a metal, the high frequency power cannot penetrate the intermediate layer. Therefore, the intended function of the dielectric material portion can be effectively maintained.

In the present invention, it is preferable that a gap between the adjacent island-shaped parts of the intermediate layer is smaller than the skin depth of the high frequency power for generating a plasma. Accordingly, it is possible to ensure that the intermediate layer blocks off the high frequency power.

In the electrode, the base portion made of a conductive material forming a basic material can be made of a metal or metal-ceramic composite material. In case the base portion is made of a metal-ceramic composite material, since its thermal expansion coefficient is smaller than that of metal, it is possible to reduce the discrepancy of thermal expansion between the base portion and the dielectric portion. Ultimately, this almost eliminates the mechanical imprecision between the portions. Further, only a small discrepancy in thermal expansion also helps to minimize defects such as fine cracks in the thermal spraying treatment. Moreover, since the mechanical defects from thermal expansion discrepancy are kept minimal, it is possible to bond the base portion and the dielectric portion with a brazing metal. By using the brazing metal to bond them, any gaps between the base portion and the dielectric material can be sealed, thereby preventing gas leakage or thermal resistance from the gaps. Furthermore, no gap is formed on the thermally sprayed film covering the entire surface of the basic material.

When the base portion made of a basic material is formed of a metal-ceramic composite material, it is preferable to impregnate metal into a porous ceramic material. Further, when a metal-ceramic composite material is used, it is possible to join the base portion and the dielectric portion by charging therebetween the metal impregnated into the base portion. As a result, in addition to any effects from using brazing metal as a joint, the process becomes simplified. Further, although a metal having a lower melting point than that of the brazing metal is used as impregnating metal, the same effects of using a brazing metal are obtained.

Further, the above electrode may have a plurality of gas discharge openings penetrating the basic material, intermediate layer and thermally sprayed film, wherein sleeves made of a dielectric material are provided around the respective gas discharge openings. Accordingly, even through the inner walls of the gas discharge openings have a low plasma resistance, they are protected by the sleeve.

As for the plasma processing apparatus, it is possible to employ a plasma processing apparatus in which the first and the second electrode, respectively serving as an upper and a lower electrode, are vertically disposed opposite to each other, and the plasma generating unit has a high frequency power supply for applying a high frequency power to the second electrode on which an object to be processed is mounted, wherein the first electrode has the configuration of the present invention.

In such a plasma processing apparatus, the processing gas inlet unit has a showerhead for discharging gas from a plurality of openings, and the first electrode serving as a shower plate of the bottom surface of the showerhead has a plurality of gas discharge openings.

In accordance with the present invention, a high frequency current can be blocked off between the island-shaped parts forming the intermediate layer, which are isolated from each other. Therefore, in case a high frequency plasma is discharged on the side of the thermally sprayed film, a high frequency power can be prevented from flowing through the intermediate layer.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Hereinafter, preferred embodiments of the present invention will be described in detail with reference to the accompanying drawings.

Figure 1:
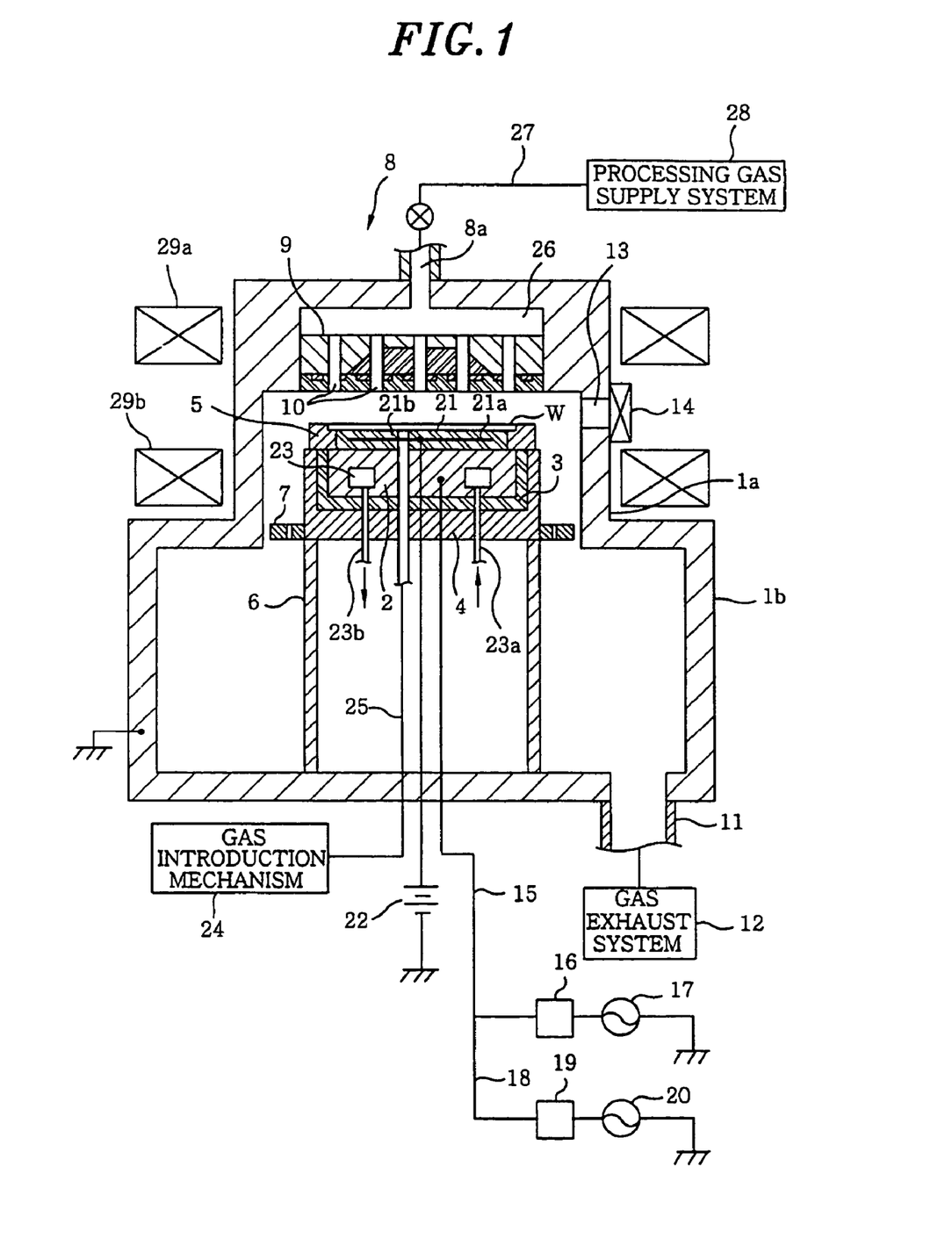
FIG. 1 shows a cross-sectional view illustrating an RIE plasma etching apparatus to which an electrode in accordance with a first preferred embodiment of the present invention is employed as an upper electrode.

FIG. 1 shows a cross-sectional view illustrating an RIE plasma etching apparatus employing an electrode in accordance with a first preferred embodiment of the present invention as the upper electrode. Such etching apparatus includes a chamber (processing vessel) 1 with wall portions made of, e.g., aluminum, the chamber being sealed airtight and having a stepped cylindrical shape composed of an upper portion 1a of a smaller diameter and a lower portion 1b of a larger diameter.

Installed in the chamber 1 is a supporting table 2 horizontally supporting a semiconductor wafer W made of Si or the like as an object to be processed and also serving as a lower electrode. The supporting table 2 is made of, e.g., aluminum, and supported at a conductive support 4 via an insulating plate 3. Further, installed around the upper periphery of the insulating plate 3 is a focus ring 5 formed of, e.g., Si. A lower portion of the support 4 is covered by a cover 6. Further, a baffle plate 7 is provided on the outside of the support 4, and the support 4 is connected with the chamber 1 via the cover 6. The chamber 1 is grounded.

A ceiling wall portion of the chamber 1 is formed as a showerhead 8 for introducing a processing gas into the chamber 1, and a bottom surface of the showerhead 8 is formed as an upper electrode 9 serving as a shower plate. The upper electrode 9 is provided opposite and parallel to the supporting table 2 serving as a lower electrode and has a plurality of gas discharge openings 10. In other words, the supporting table 2, i.e., the lower electrode, and the upper electrode 9 form a pair of parallel plate type electrodes. Further, the upper electrode 9 is grounded via the chamber 1. Detailed configurations of the showerhead 8 and the upper electrode 9 will be described later.

A gas exhaust port 11 is formed in the bottom wall of the lower portion 1b of the chamber 1, and a gas exhaust unit 12 is connected to the gas exhaust port 11. Further, by operating a vacuum pump of the gas exhaust unit 12, an inner space of the chamber 1 can be depressurized to a specific vacuum level. Meanwhile, a loading/unloading gate 13 for a semiconductor wafer W is provided in the sidewall of the upper portion 1a of the chamber 1, and the gate 13 is opened and closed by a gate valve 14.

A first feeder line 15 is connected to the supporting table 2, and a first matching unit 16 and first high frequency power supply 17 for forming a plasma are connected to the first feeder line 15. Further, a high frequency power of a specific frequency of, e.g., 100 MHz, is supplied from the first high frequency power supply 17 to the supporting table 2.

A second feeder line 18 is branched from the first feeder line 15, and a second matching unit 19 and second high frequency power supply 20 are connected to the second feeder line 18. The second high frequency power supply 20 supplies a high frequency power with a specific frequency, e.g., 3.2 MHz, lower than that of the first high frequency power supply 17, so that it overlaps with the high frequency power for forming a plasma.

Installed on the surface of the supporting table 2 is an electrostatic chuck 21 for electrostatically adsorbing and maintaining a semiconductor wafer W. The electrostatic chuck 21 is formed by interposing an electrode 21a between insulating members 21b, wherein a DC power supply 22 is connected to the electrode 21a. Further, by applying a voltage from the DC power supply 22 to the electrode 21a, the semiconductor wafer W is adsorbed by an electrostatic force, e.g., a Coulomb force.

A coolant chamber 23 is provided in the supporting table 2, and a coolant circulates therein. That is, the coolant is introduced into the coolant chamber 23 via a coolant introducing line 23a and discharged through a coolant discharge line 23b. Cold heat of the coolant is thermally conducted to the semiconductor wafer W via the supporting table 2 and, accordingly, a processing surface of the semiconductor wafer W is controlled to be at a desired temperature.

Moreover, although the chamber 1 is vacuum pumped by the gas exhaust unit 12 and then maintained at a vacuum, a cooling gas is introduced into a gap between the surface of the electrostatic chuck 21 and the backside of the wafer W through a gas supply line 25 by a gas introduction mechanism 24 so that the semiconductor wafer W can be effectively cooled by the coolant circulating in the coolant chamber 23. With the cooling gas introduced thereinto, cold heat of the coolant is efficiently transferred to the semiconductor wafer W, thereby improving the cooling efficiency.

As described above, the showerhead 8 has the upper electrode 9 as the shower plate having the plurality of gas discharge openings 10 in the bottom surface thereof and a gas inlet 8a at a top surface thereof. Further, a space 26 for diffusing a gas is formed therein. A gas supply line 27 is connected to the gas inlet 8a, and a processing gas supply system 28 for supplying a processing gas is connected to the other end portion of the gas supply line 27.

As for a processing gas, a highly corrosive gas containing halogen element such as fluorine (F) or chlorine (Cl) is used. Such processing gas supplied from the processing gas supply system 28 reaches the space 26 of the showerhead 8 via the gas supply line 27 and the gas inlet 8a and is then discharged from the gas discharge openings 10.

In the meantime, two multi-pole ring magnets 29a and 29b are disposed around the periphery of the upper portion 1a of the chamber 1 such that the gate 13 is interposed therebetween. The multi-pole ring magnets 29a and 29b are formed by attaching a plurality of columnar anisotropic segment magnets to a ring-shaped case made of a magnetic material, wherein magnetic pole orientations between the adjacent multiple columnar segment magnets are opposite from each other. Accordingly, magnetic force lines are formed between the adjacent segment magnets, so that a magnetic field is formed only at a peripheral portion of a processing space between the upper and lower electrodes, thereby confining a plasma in the processing space.

Hereinafter, configurations of the upper electrode 9 will be described in detail.

Figure 2:
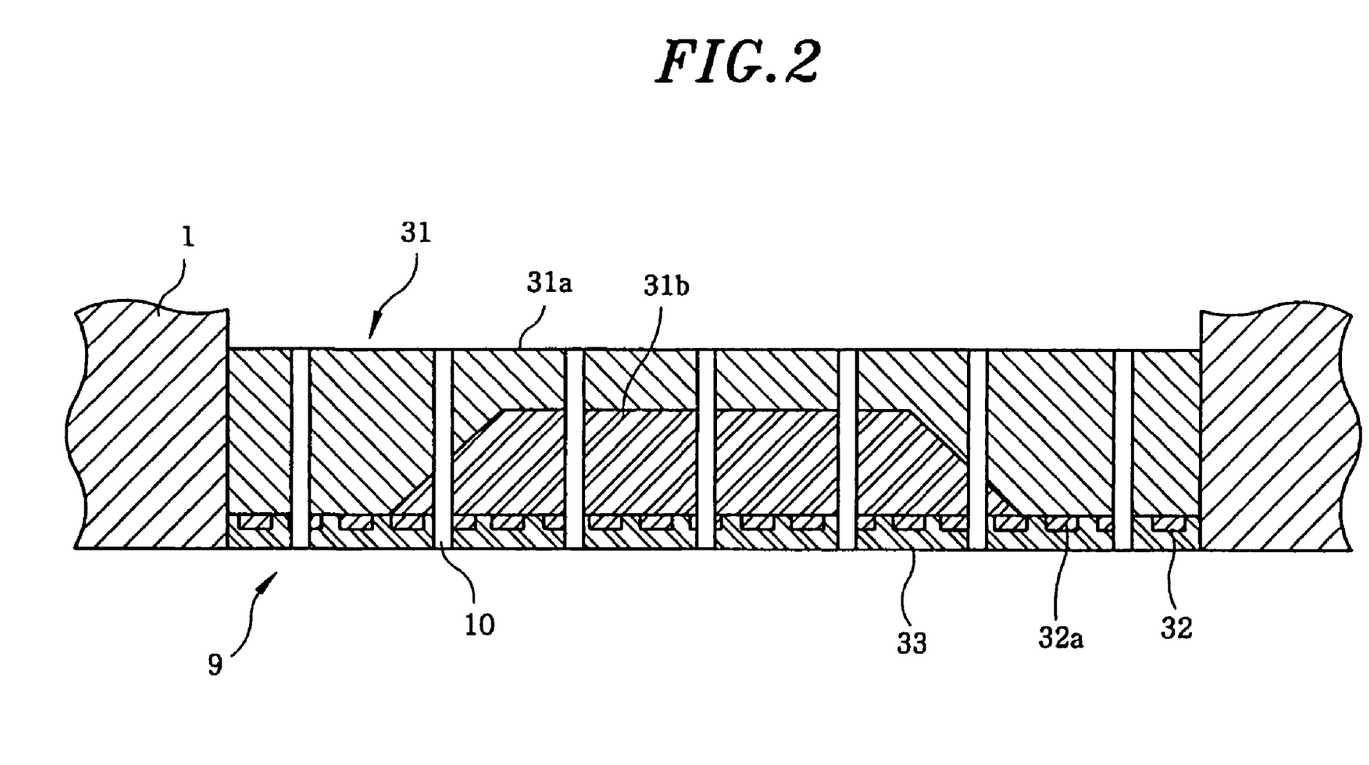
FIG. 2 describes an enlarged cross-sectional view depicting the upper electrode of the apparatus of FIG. 1.

As shown in FIG. 2 illustrating an enlarged cross sectional view of the upper electrode 9, the upper electrode 9 is configured by sequentially forming a bond-coat layer 32 as a metallic intermediate layer and a thermally sprayed film 33 made of an insulating ceramic on the bottom surface, i.e., a surface of a basic material 31.

The basic material 31 has a base portion 31a made of a conductive material such as Al, Si or the like and a dielectric portion 31b interposed in the central portion of the base portion to include the mid section of the bottom surface. The dielectric portion 31b provides the functions as described below.

To elaborate, when a basic material of an electrode is entirely formed of a conductor, the central position of the bottom surface of the electrode is exposed to a plasma and it becomes an exposed end in an RF equivalent circuit. As a result, a distribution of electric field supplied to a plasma becomes a standing wave type, which results in a nonuniform plasma density. Such tendency becomes markedly widespread as the frequency of a high frequency power is raised to form a high-density plasma. To that end, by providing a dielectric portion at the central portion, the high frequency power is reduced at such portion and the strength of an electric field at the bottom central portion of the electrode 9 is also decreased. As a result, the strength of the electric field at the bottom surface of the electrode becomes uniform, thereby uniformizing the plasma density.

From such point of view, the dielectric portion 31b employs a material having a relatively high dielectric constant, e.g., alumina ($Al_2O_3$), aluminum nitride (AlN), silicon nitride ($Si_3N_4$), silica ($SiO_2$), yttrium oxide ($Y_2O_3$) or the like.

The base portion 31a and the dielectric portion 31b forming the basic material 31 are joined together by using, e.g., screws. In this case, it is preferable to provide a thermally conductive sheet, e.g., a silicon rubber, therebetween.

The thermally sprayed film 33 needs to be formed of an insulating ceramic having a high plasma resistance, e.g., alumina ($Al_2O_3$) or yttrium oxide ($Y_2O_3$).

The bond-coat layer 32 is formed for improving adhesiveness of the thermally sprayed film 33, and preferably made of a soft metal such as aluminum (Al) or nickel (Ni). The bond-coat layer 32 is comprised of a plurality of island-shaped parts 32a isolated from each other. A method for forming the bond-coat layer 21 is not particularly limited. However, it is preferable to employ a thermal spraying method using a mask. With such method, it is possible to form the multiple island-shaped parts 32a isolated from each other relatively easily.

Although shapes of the island-shaped parts 32a forming the bond-coat layer 32 are not particularly limited, they are preferable to have a shape that they can be arranged with ease in a regular pattern. For example, they may have a circular shape shown in FIG. 3A or a square shape illustrated in FIG. 3B.

In such configured plasma etching apparatus, first, a semiconductor wafer W is loaded into the chamber 1 through the gate 13 by opening the gate valve 14 and, then, mounted on the supporting table 2. Next, the inner space of the chamber 1 is vacuum pumped through the gas exhaust port 11 by a vacuum pump of the gas exhaust unit 12.

Further, in a condition where a processing gas is introduced at a specific flow rate from the processing gas supply system 28 into the chamber 1 and a gas pressure in the chamber 1 is set at, e.g., 13 Pa to 1333 Pa (100 mTorr to 10 Torr), a high frequency power of, e.g., 100 MHz, for forming a plasma is supplied from the first high frequency power supply 17 to the supporting table 2. As a result, a high frequency power electric field is formed between the upper electrode 9 and the supporting table 1 serving as a lower electrode. Furthermore, a high frequency power of, e.g., 3.2 MHz, for attracting ions is supplied from the second high frequency power supply 30 to the supporting table 2 overlaping with the plasma-forming high frequency power supply from the first high frequency power supply 17. At this time, the semiconductor wafer W is adsorptively held on the electrostatic chuck 21 by a specific voltage applied from the DC power supply 22 to the electrode 21a of the electrostatic chuck 21, e.g., by the Coulomb force.

In such state, a high frequency plasma of the processing gas is formed in a processing space between the upper electrode 9 and the supporting table 2 serving as a lower electrode, and then, a specific film of the semiconductor wafer W is etched.

Figure 4:
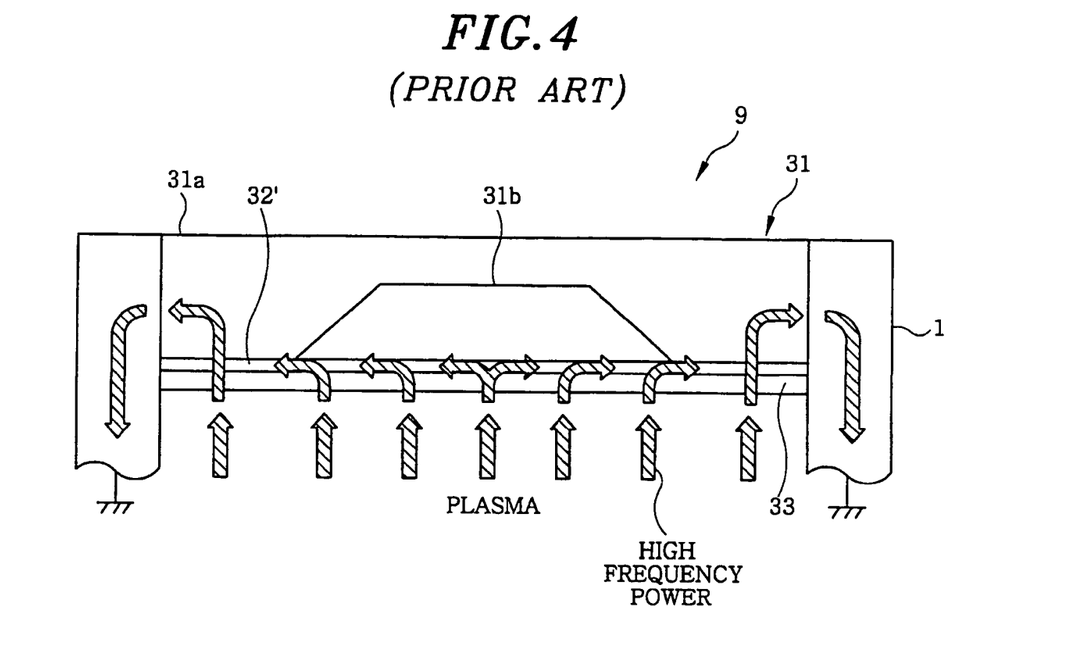
FIG. 4 represents a schematic diagram illustrating a propagation pattern of a high frequency power from a plasma, with respect to a continuous bond-coat layer (intermediate layer) between a basic material of the upper electrode and a thermally sprayed film.

At this time, a high frequency power from the plasma formed in the processing space reaches the upper electrode 9 and, then, flows into a ground via the wall portions of the chamber 1. However, in a conventional case, as illustrated in FIG. 4, a continuous bond-coat layer 32' is interposed between the basic material 31 and the thermally sprayed film 33. In that case, since the bond-coat layer 32' becomes a passageway for a high frequency power, the high frequency power from the plasma flows through the bond-coat layer 32' into the ground. Accordingly, the conventional case behaves as if the dielectric portion 31b is not present with respect to the plasma, so that the intended effect of the dielectric portion 31b, which is to decrease the high frequency power, is not effectively obtained.

Figure 5:
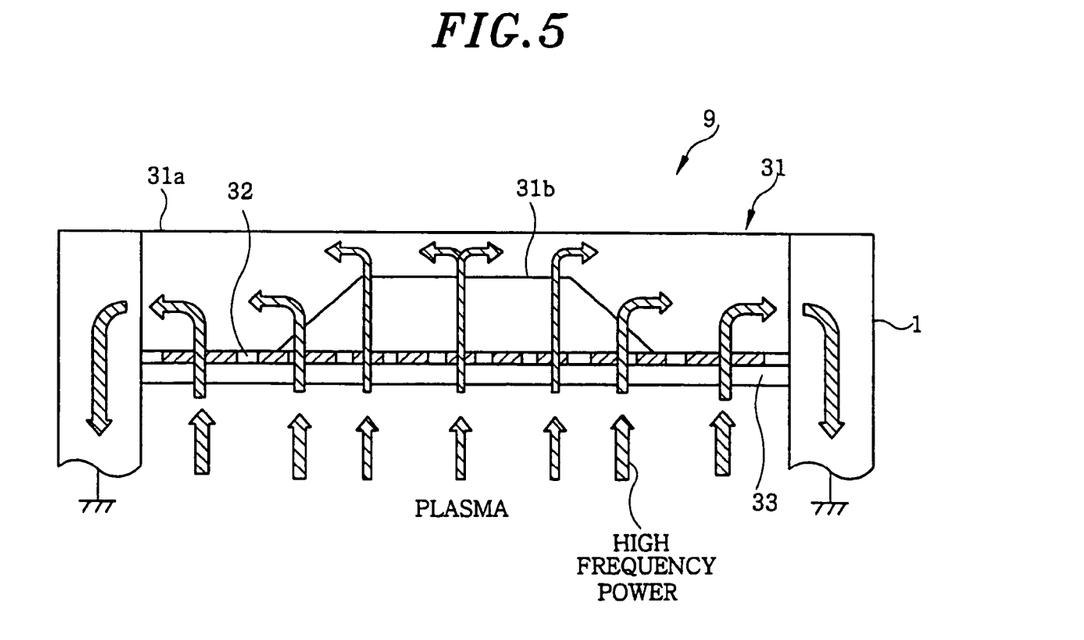
FIG. 5 offers a schematic diagram depicting a propagation pattern of a high frequency power from a plasma, with respect to a bond-coat layer (intermediate layer) between a basic material of the upper electrode and a thermally sprayed film, which is composed of a plurality of island-shaped parts isolated from each other in accordance with the present invention.

To that end, in this embodiment, the bond-coat layer 32, i.e., the metallic intermediate layer, is comprised of the multiple island-shaped parts 32a, which are isolated from each other. As illustrated in FIG. 5, since the high frequency power can be blocked off between the island-shaped parts 32a, the high frequency power flows through the basic material 31, but not the bond-coat layer 32. Therefore, the effect of the dielectric portion 31b of the basic material 31, which is capable of decreasing the high frequency power, is effectively maintained.

Figure 3A:
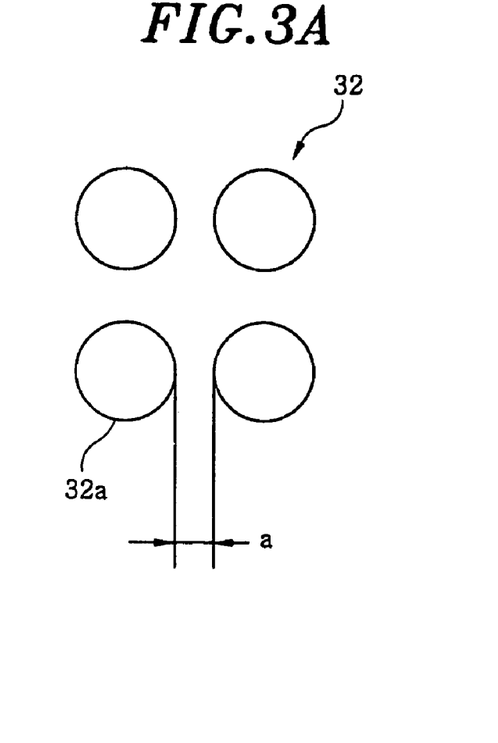
FIGS. 3A and 3B each provide a schematic diagram showing an exemplary shape and arrangement pattern of island-shaped parts of a bond-coat layer (intermediate layer) used in the upper electrode of FIG. 2.
Figure 3B:
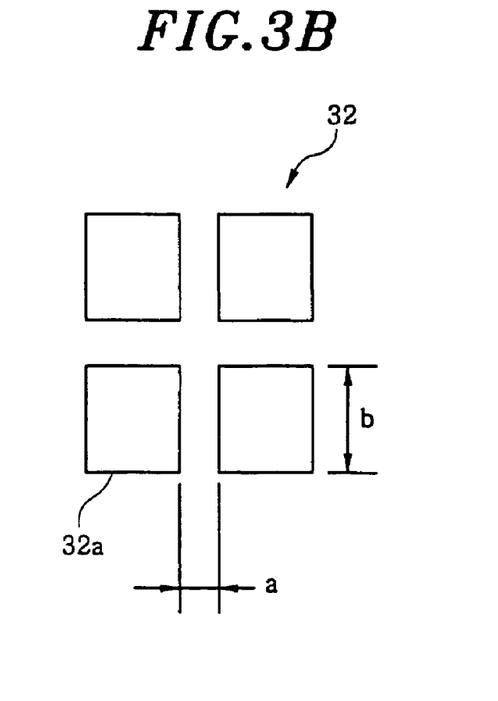

A minimum distance (gap) a (see FIGS. 2 and 3) between adjacent island-shaped parts 32a forming the bond-coat layer 32 is determined according to the skin depth of the frequency of a high frequency power applied thereto. To elaborate, the high frequency power flows through the surface portion of the conductor portion, and the thickness of such portion becomes the skin depth. Further, if the distance (gap) a between adjacent island-shaped parts 32a is greater than the skin depth, the high frequency power is not conducted. However, the capacity for blocking a high frequency power and the adhesiveness of the bond-coat layer 32 are in a reciprocal relationship and, therefore, if the distance between the adjacent island-shaped parts 32a is set to be too far, the adhesiveness would deteriorate. Moreover, the skin depth δ is defined by an equation of $\delta=(2/\omega\sigma\mu)^{1/2}$ (wherein, $\omega=2\pi f$ (f: frequency), σ: conductivity, μ: magnetic permeability)

In addition, if the area of island-shaped part 32a is made excessively large, electric charges stored in a single island-shaped part would increase, so that an unexpected discharge could occur. From such point of view, it is preferable to minimize the area of the island-shaped part 32a. However, if the area thereof is made excessively small, the total area of the bond-coat portion becomes small, thereby deteriorating the adhesiveness thereof. Therefore, it is necessary to set an optimal area considering this issue.

For example, when the frequency of the high frequency power for forming a plasma is 1000 MHz, the distance (gap) a between the island-shaped parts 32a is preferably about 0.1 mm to 0.2 mm. Further, in case the island-shaped parts 32a have a square shape as shown in FIG. 3B, the length b of one side is preferably about 0.7 mm.

Figure 6:
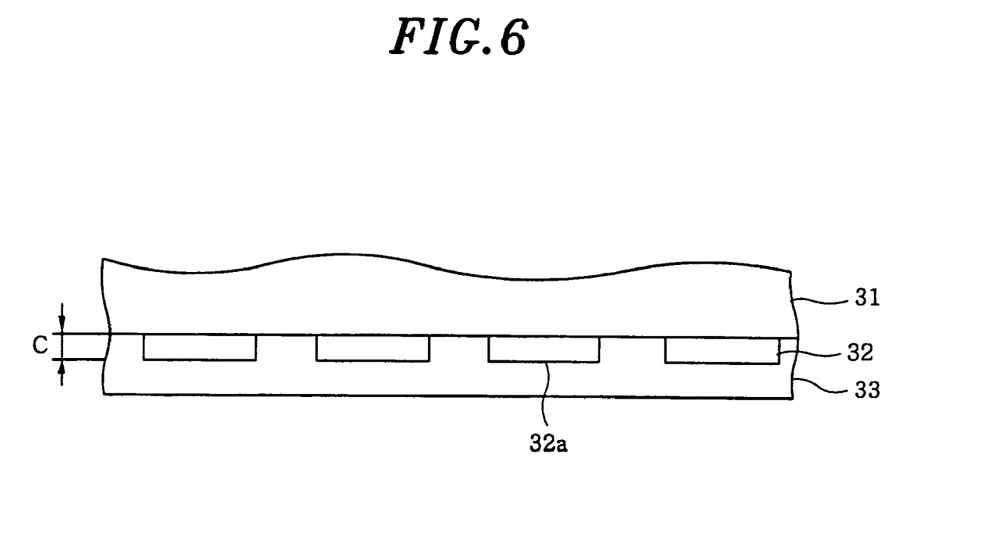
FIG. 6 presents a cross-sectional view schematically showing an enlarged bond-coat layer (intermediate layer) used in the upper electrode.

Further, if the thickness c of the bond-coat layer 32 shown in FIG. 6 becomes thick, the final thermally sprayed surface becomes less flat, the surface being formed after the thermally sprayed film 33 is formed. Accordingly, the thickness is preferable to be as thin as possible. However, if it is too thin, the effect of improving its adhesiveness is reduced. Hence, the thickness c of the bond-coat layer 32 is preferably about 0.03 to 0.05 mm.

Hereinafter, another embodiment of a structure of the upper electrode will be described.

Figure 7:
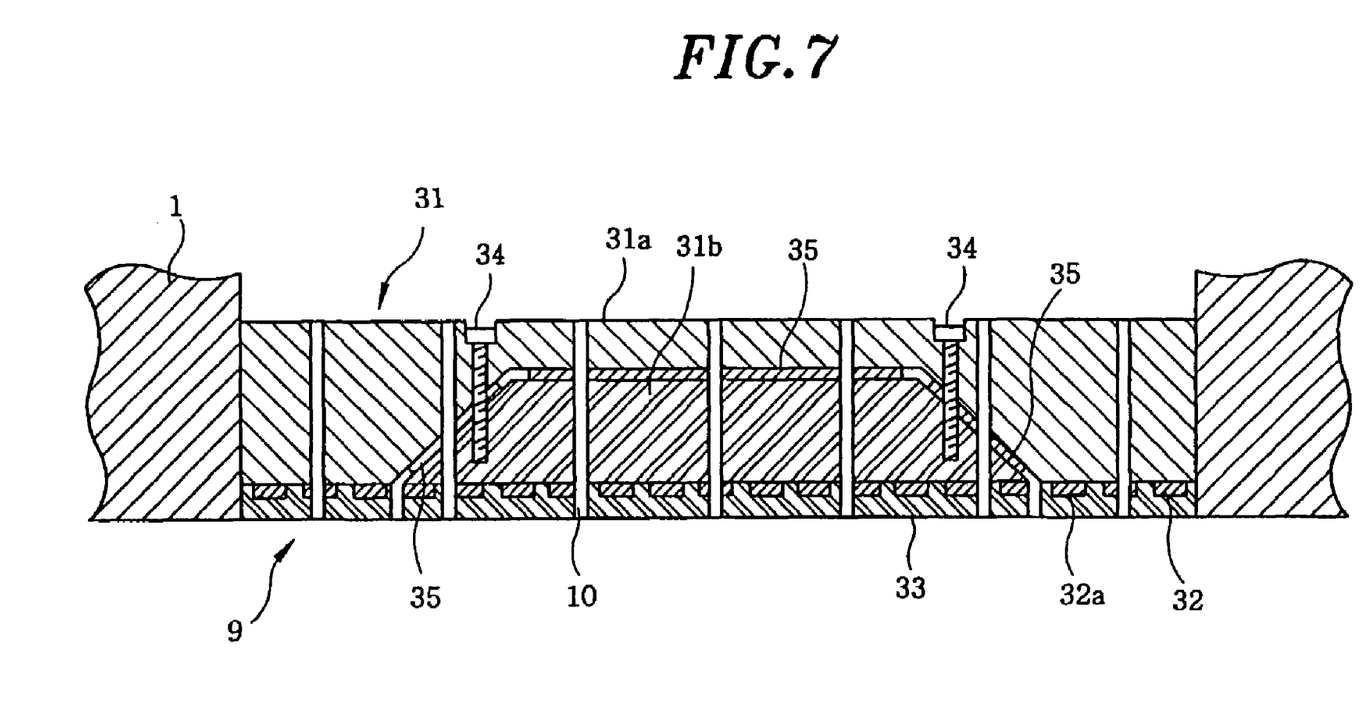
FIG. 7 sets forth a cross-sectional view illustrating an upper electrode including a basic material having a structure in which a base portion made of a metal and a dielectric portion are fixed to each other with screws and a thermally conductive sheet disposed therebetween.

In the aforementioned upper electrode 9, as illustrated in FIG. 7, as the basic material 31, the base portion 31a made of a metal such as Al or the like and the dielectric portion 31b are joined together by using screws 34 with the thermally conductive sheet 35 interposed therebetween. In such case, the following problems exist:

1. Since a thermal expansion coefficient of a metal forming the base portion 31a is greater than that of a dielectric material of the dielectric portion 31b, a mechanical imprecision is likely to occur between the base and dielectric portions under a high temperature condition.

2. When the base portion and dielectric portions are joined by screws, to avoid a possible breakage thereof, a large torque cannot be applied to the screws. As a result, an introduction gas may leak and a dimensional or attachment imprecision may result. Although this error can be diminished by using a thermally conductive sheet such as a silicon rubber or the like, it cannot be fully eliminated. So the thermally conductive sheet may rather deteriorate with time while being used in a high temperature condition. Further, since the thermally conductive sheet has a low resistance against a plasma from the gas discharge openings and is likely to have a low thermal resistance, a thermal shock fracture of the dielectric portion tends to be common. The uniformity of surface temperature distribution is also adversely affected as a result.

3. In case the base portion 31a and the dielectric portion 31b are joined together by screws, gaps form therebetween and hence on the thermally sprayed surface as well. As a result, a plasma resistance or an abnormal discharge can occur at such portions.

Figure 8:
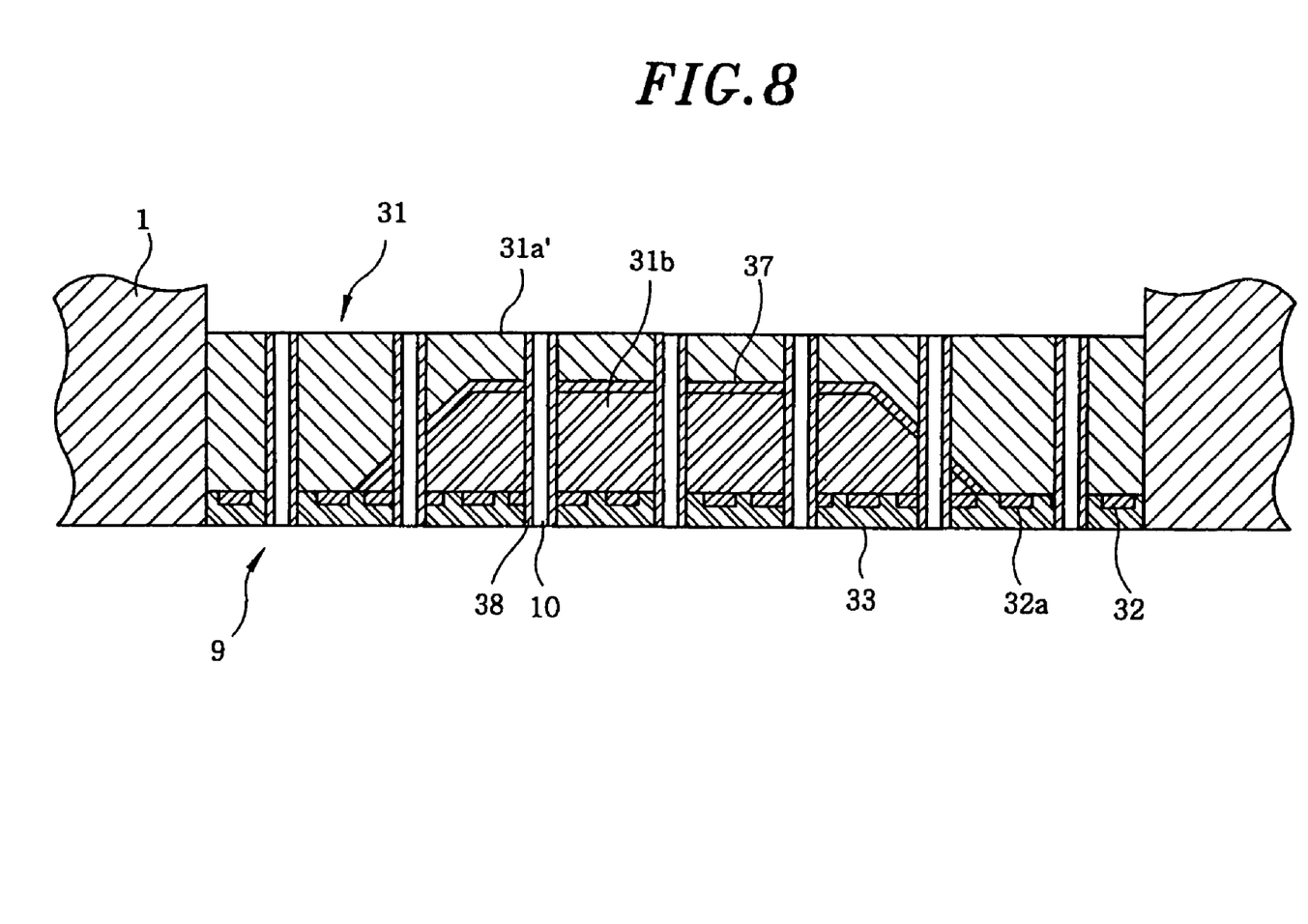
FIG. 8 depicts a cross-sectional view describing an upper electrode including a basic material having a structure in which a base portion composed of a metal-ceramic composite material and a dielectric portion are joined with a brazing metal.

To deal with the issues above, here, as illustrated in FIG. 8, the basic material 31 of the upper electrode 9 is composed of a base portion 31a' (made of a metal-ceramic composite material) and a dielectric portion 31b', wherein they are joined together by a brazing metal 37. Further, the sleeve 38 made of a dielectric material is provided around the gas discharge openings 10. Furthermore, the bond-coat layer 32 and the thermally sprayed film 33 are formed in the same manner as in the aforementioned embodiment.

The base portion 31a' composed of the metal-ceramic composite material forming the basic material 31 has both a high conductivity of metal and a low thermal expansibility of ceramic. Thus, even at a high temperature, a thermal expansion discrepancy between the base portion 31a' and the dielectric portion 31b is small, so that a mechanical imprecision therebetween can be significantly eliminated. Further, since the thermal expansion discrepancy therebetween is small, defects such as fine cracks in the thermal spraying process rarely occur. Furthermore, since the mechanical imprecision caused by he thermal expansion discrepancy can be reduced, they can be joined to each other by the brazing metal 37 without screws. As described above, by using the brazing metal 37, the gap between the base portion 31a' and the dielectric portion 31b can be sealed therewith, preventing a thermal resistance resulting from the leakage of introduction gas or the gap. Moreover, since there is no gap at the interface of the base portion 31a' and the dielectric portion 31b, no gap is present on the thermally sprayed film 33 formed on the entire basic material surface. Besides, the metal-ceramic composite material has a high thermal conductivity, so that a nonuniformity of temperature rarely occurs on the upper electrode 9. If the dielectric portion 31b employs a material having a high thermal conductivity, particularly AlN, the entire basic material 31 can have an extremely high thermal conductivity. Accordingly, a temperature distribution of the upper electrode 9 can be further uniformized.

In addition, by providing the sleeve 38 made of a dielectric material around the gas discharge openings 10, the brazing metal 37 can be protected from a plasma coming in through the gas discharge openings 10, so that the chamber atmosphere can be prevented from being contaminated by the brazing metal 37 scattered by the plasma. A material of the sleeve 38 is preferably a high purity material having a high stability against the plasma. The material also needs to have an affinity for the brazing metal. Accordingly, as the sleeve 38, it is preferable to use a dielectric material identical to that of the dielectric portion 31b.

As for the metal-ceramic composite material, it is possible to appropriately employ a material formed by impregnating a metal into a porous ceramic and compressing it. As for the porous ceramic, $Al_2O_3$, $SiO_2$ or the like can be used. As for the metal, Al, Ni or the like can be used. Since, however, Al has a low melting point, if the brazing metal has a higher melting point than Al, Al would melt during the brazing process, which limits its application as a result.

In this case, it is preferable to perform the brazing adhesion during a process for impregnating a metal into a porous dielectric material. Accordingly, it is possible to completely seal any gaps between the base portion 31a' and the dielectric portion 31b.

There has been described in the above example that the base portion 31a' made of the metal-ceramic composite material and the dielectric portion 31b are joined together by using the brazing metal 34. However, while the base portion 31a' is formed by impregnating the metal into a porous ceramic, the base portion 31a' and the dielectric portion 31b may be adhered to each other by filling the gap therebetween with the impregnated metal.

Hereinafter, a method therefor will be described in detail with reference to FIG. 9.

Figure 9A:
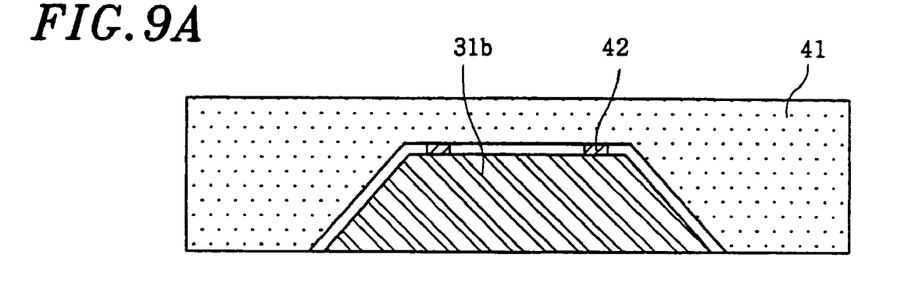
FIGS. 9A to 9D show diagrams for explaining a method for joining a base portion and a dielectric portion with an impregnated metal when the base portion is formed by impregnating a metal into a porous ceramic material.
Figure 9B:
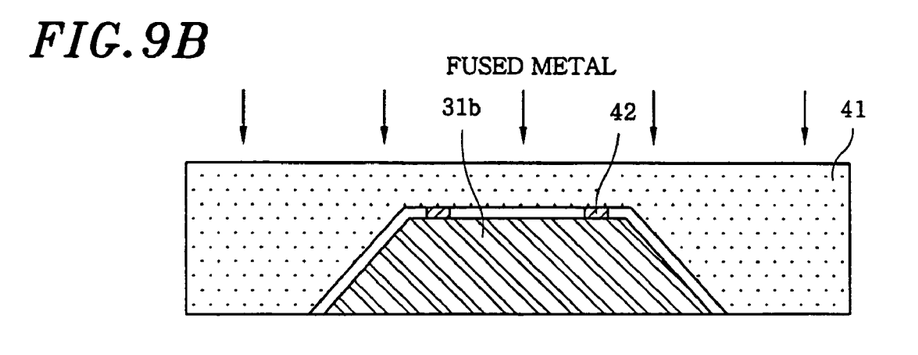
Figure 9C:
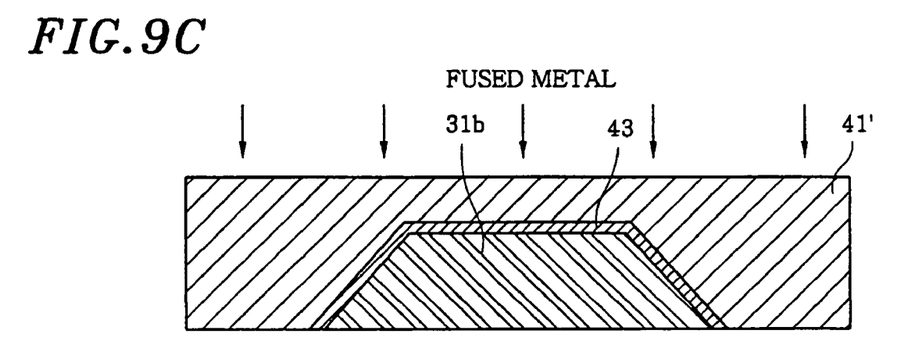
Figure 9D:
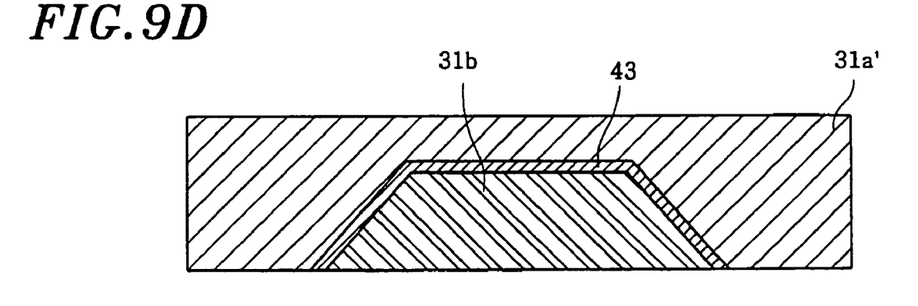

First, the dielectric portion 31b is provided at the porous ceramic 41 that is a precursor of the base portion 31a' with a uniform gap provided by spacers 42 therebetween (see FIG. 9A). At this time, the sleeve 38 is provided in advance (not illustrated in FIGS. 9A to 9B). Next, a molten metal is pressurized by a gas pressure or the like and then impregnated into the porous ceramic 41 (see FIG. 9B). By keeping the pressurization of the molten metal even after the molten metal spread throughout the porous ceramic 41, a space between a porous ceramic 41' and the dielectric portion 31b is sealed with the molten metal and then becomes a junction layer 43 (see FIG. 9C). Thereafter, by cooling them, the basic material 31 composed of the base portion 31a' and the dielectric portion 31b is obtained with the junction layer 43 made of the impregnated metal (see FIG. 9D).

By employing such method, the base portion 31a' and the dielectric portion 31b can be joined together without using the brazing metal while the metal is impregnated, so that the process becomes simplified and the impregnated metal can be selected without regard to its melting point. Accordingly, in comparison with a case using the brazing metal, the choice of impregnated metal is not as limited, therefore, Al having a low melting point can be used as a impregnated metal.

Further, the present invention can be varied without being limited to the aforementioned embodiments. For example, in the aforementioned embodiments, there has been described a case where the present invention is applied to the upper electrode of the RIE plasma etching apparatus. However, the present invention may be applied to any electrode as long as it is used under the condition that a high frequency power from a high frequency plasma is supplied thereto in a parallel plate type plasma processing apparatus. Moreover, without being limited to the electrode, the present invention may be applied to a thermally sprayed member used under a condition where the high frequency power from the high frequency plasma is supplied thereto and it is required to prevent the high frequency power from flowing through a metallic intermediate layer serving as a bond-coat layer.

While the invention has been shown and described with respect to the preferred embodiments, it will be understood by those skilled in the art that various changes and modification may be made without departing from the spirit and scope of the invention as defined in the following claims.

What is claimed is:

1. An electrode for generating a high frequency plasma on a side of a thermally sprayed film, comprising: a basic mateial including a base portion made of a conductive material and a dielectuic portion provided to include a part of a surface of the basic material; the thermally sprayed film formed on the surface of the basic material, the thermally sprayed film being made of an insulating ceramic; and a metallic intermediate layer provided between the basic material and the thermally sprayed film, for increasing a bonding strength therebetween, wherein the intermediate layer includes a plurality of island-shaped parts isolated from each other so as to prevent a high frequency power from flowing between the island-shaped parts.

2. The electrode of claim 1, wherein a gap between the adjacent island-shaped parts of the intermediate layer is greater than a skin depth of a high frequency power for generating a plasma.

3. The electrode of claim 1, wherein the base portion is made of a metal.

4. The electrode of claim 1, the base portion is made of a metal-ceramic composite material.

5. The electrode of claim 4, wherein the metal-ceramic composite material forming the base portion is obtained by impregnating a metal into a porous ceramic.

6. The electrode of claim 5, wherein the base portion and the dielectric portion are joined together by sealing a gap therebetween with the metal impregnated into the base portion.

7. The electrode of claim 4, wherein the base portion and the dielectric portion are joined together by using a brazing metal.

8. The electrode of claim 1, wherein a plurality of gas discharge openings are formed through the basic material, the intermediate layer and the thermally sprayed film; and sleeves are installed around the respective gas discharge openings, the sleeves being made of a dielectric material.

9. A plasma processing apparatus for performing a plasma process on a substrate to be processed by using a plasma, the apparatus comprising: a chamber for accommodating therein an object to be processed, the chamber being maintained under a vacuum condition; a first and a second electrode disposed opposite to each other in the chamber; a processing gas introduction unit for introducing a processing gas into the chamber maintained under the vacuum condition; and a plasma generating unit for generating a plasma of the processing gas by forming a high frequency electric field between the first and the second electrode, wherein at least one of the first and the second electrode includes a basic material having a base portion made of a conductive material and a dielectric portion including a part of a surface of the basic material; a thermally sprayed film formed on the surface of the basic material, the thermally sprayed film being made of an insulating ceramic; and a metallic intermediate layer provided between the basic material and the thermally sprayed film for increasing a bonding strength therebetween, the intermediate layer including a plurality of island-shaped parts isolated from each other so as to prevent a high frequency power from flowing between the island-shaped parts.

10. The plasma processing apparatus of claim 9, wherein the first and the second electrode are vertically disposed opposite to each other and serve as an upper and a lower electrode, respectively; the object to be processed is mounted on the second electrode; the plasma generating unit has a high frequency power supply for applying a high frequency power to the second electrode; and the first electrode includes the basic formed on the surface of the basic material, the thermally sprayed film being made of an insulating ceramic, and the metallic intermediate layer provided between the basic material and the thermally sprayed film for increasing the bonding strength therebetween, the intermediate layer including the plurality of island-shaped parts isolated from each other so as to prevent a high frequency power from flowing between the island-shaped parts.

11. The plasma processing apparatus of claim 10, wherein the processing gas introduction unit has a showerhead for discharging a gas from a plurality of openings, and the first electrode serves as a shower plate of a bottom surface of the showerhead, the first electrode having a plurality of gas discharge openings.

12. The plasma processing apparatus of claim 9, wherein a gap between the adjacent island-shaped parts of the intermediate layer is greater than a skin depth of a high frequency power for generating a plasma.

* * * * *